(12) United States Patent
Reblewski et al.

(10) Patent No.: US 6,947,882 B1
(45) Date of Patent: Sep. 20, 2005

(54) REGIONALLY TIME MULTIPLEXED EMULATION SYSTEM

(75) Inventors: Frederic Reblewski, Paris (FR); Olivier Lepaps, Paris (FR); Jean Barbier, Chatillon (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 09/404,920

(22) Filed: Sep. 24, 1999

(51) Int. Cl.[7] ............................................. G06F 9/455
(52) U.S. Cl. ............................ 703/23; 703/27; 703/24
(58) Field of Search .............................. 703/28, 23, 24, 703/27; 326/93, 96, 38, 39, 41; 712/15, 37

(56) References Cited

U.S. PATENT DOCUMENTS

| | | |
|---|---|---|
| 4,642,487 A | 2/1987 | Carter |
| 4,758,985 A | 7/1988 | Carter |
| 5,036,473 A | 7/1991 | Butts et al. |
| 5,363,319 A * | 11/1994 | Okuda .......................... 703/15 |
| 5,574,388 A | 11/1996 | Barbier et al. |
| 5,596,742 A | 1/1997 | Agarwal et al. |
| 5,649,176 A | 7/1997 | Selvidge et al. .............. 716/16 |
| 5,659,716 A | 8/1997 | Selvidge et al. .............. 703/23 |
| 5,701,441 A * | 12/1997 | Trimberger .................. 326/39 |
| 5,761,484 A | 6/1998 | Agarwal et al. |
| 5,777,489 A | 7/1998 | Barbier et al. |
| 5,847,578 A | 12/1998 | Noakes et al. |
| 5,854,752 A | 12/1998 | Agarwal |
| 5,920,712 A | 7/1999 | Kuijsten |
| 5,960,191 A * | 9/1999 | Sample et al. ................ 703/23 |

FOREIGN PATENT DOCUMENTS

| | | |
|---|---|---|
| WO | WO 94/06210 | 3/1994 |
| WO | WO 94/23389 | 10/1994 |

OTHER PUBLICATIONS

Shibata, Y.; Miyazaki, H.; Xiao–Ping Ling; Amano, H., Towards the realistic "virtual hardware," Innovative Architecture for Future Generation High–Performance Processors and Systems, 1997, 1998 pp.: 50–55.*

Varghese, J.; Butts, M.; Batcheller, J., "An efficient logic emulation system," IEEE Transactions on Very Large Scale Integration (VLSI) Systems, vol.: 1 Issue: 2, Jun. 1993 pp.: 171–174.*

Lo, W.Y.; Choy, C.S.; Chan, C.F., "Hardware emulation board based on FPGAs and Programmable Interconnections," Proceedings of the Fifth International Workshop on Rapid System Prototyping, 1994. Shortening the Path from Spec to Prototype. pp.: 126–130.*

(Continued)

Primary Examiner—B. D. Thomson
(74) Attorney, Agent, or Firm—Banner & Witcoff, Ltd.

(57) ABSTRACT

A regionally time multiplexed emulation system includes an emulator for emulating a circuit design. The emulator includes a plurality of reconfigurable logic devices with buffered I/O pins and reconfigurable logic elements. The reconfigurable logic devices are reconfigurable to emulate a circuit design using at least one user clock to clock the logic elements and at least one signal routing clock to time multiplex the routing of emulation signals between the reconfigurable logic devices, with the at least one signal routing clock being independent of the at least one user clock.

20 Claims, 11 Drawing Sheets

OTHER PUBLICATIONS

Babb, et al., "Logic Emulation with Virtual Wires," IEEE Transactions on Computer–Aided Design of Integrated Circuits and Systems, vol. 16, No. 6, Jun. 1997, pp. 609–626.

Berger, "Teramac HW Simulator System External Reference Specification," Nov. 7, 1991, Revision 1.1, pp. 3–37.

Snider et al., "The PLASMA Chip Specification," Aug. 1, 1995, pp. 1–124.

Snider et al., "The Teramac Configurable Compute Engine," Field Programmable Logic and Applications, 5$^{th}$ International Workshop, FPL '95 Oxford, United Kingdom, pp. 44–53.

XILINX, "The Programmable Gate Array Design Handbook," First Edition, 1986, pp. i–A–10.

"Translation of an Office Action of Japanese Patent Office," from a Japanese counterpart application, 7 pgs., Jul. 2, 2002.

Office Action of Japanese Patent Office, from the Japanese counterpart application, 6 pgs., Jul. 2, 2002.

* cited by examiner

US 6,947,882 B1

REGIONALLY TIME MULTIPLEXED EMULATION SYSTEM

BACKGROUND OF THE INVENTION

1. Field of the Invention

The present invention relates to the field of emulation systems. More specifically, the present invention relates to methodology for increasing capacity of an emulation system.

2. Background Information

Emulation systems for emulating circuit designs are known in the art. Typically, prior art emulation systems are formed using conventional general purpose field programmable gate arrays (FPGAs) and general purpose routing chips. A circuit design to be emulated is "realized" on the emulation system by compiling a "formal" description of the circuit design, and mapping the circuit design onto the logic elements (LEs) of the FPGAs and the routing chips.

As circuit designs have become larger and larger, up to and including designs having millions of transistors, a similar increase in size of emulation systems has become necessary in order to emulate such circuit designs. Large emulation systems typically include a significant number of FPGAs as well as a significant number of routing chips to route signals between the FPGAs. However, given the large number of FPGAs which may be included in an emulation system, the number of routing chips required to provide adequate flexibility to concurrently route large numbers of input and output signals to and from an FPGA has become prohibitively expensive.

An article by Jonathan Babb et al. entitled "Logic Emulation with Virtual Wires". (hereinafter "Babb et al.") provides one solution to this problem, referred to as "time multiplexing" or the use of "virtual wires". Using time multiplexing, multiple logical outputs of an FPGA share a single physical output with only one of the logical outputs being able to output a signal on the single physical output in any given clock cycle. Thus, the logical outputs are multiplexed on the single physical output over time. Similarly, a physical input to an FPGA is shared by multiple logical inputs with only one of the logical inputs being able to receive an input signal on the physical input in any given clock cycle. All of the FPGAs in the Babb et al. system, as well as any routing chips interconnecting the FPGAs, are clocked by the same clock signal (see, Babb et al., p. 5, § 2.1).

One problem with the Babb et al. system is that it is primarily designed to emulate synchronous logic providing synchronous signals, and does not support time multiplexing of asynchronous signals for emulating asynchronous logic. Rather, such asynchronous signals must be hard-wired to dedicated FPGA physical inputs and outputs, while the interconnection of time multiplexed synchronous signals is automatically configured for the user (see, Babb et al., p. 5, § 2.1).

Additionally, even with the use of time multiplexing, or in systems where asynchronous signals are hard-wired to dedicated inputs and outputs, other problems still exist. One such problem is that of synchronizing clock signals in the emulation system. Despite the use of time multiplexing to reduce overall system size, the system can still remain relatively large. Such systems can range in size up to a few meters square. Synchronizing high frequency clock signals across such a large area creates a significant problem.

Thus, it is desirable to have an emulation system with improved capacity without the disadvantages of conventional time multiplexing. As will be described in more detail below, the present invention provides for an emulation system that achieves these and other desired results, which will be apparent to those skilled in the art from the description to follow.

SUMMARY OF THE INVENTION

A regionally time multiplexed emulation system is described herein. The emulator includes a plurality of reconfigurable logic devices with buffered I/O pins and reconfigurable logic elements. The reconfigurable logic devices are reconfigurable to emulate a circuit design using at least one user clock to clock the logic elements and at least one signal routing clock to time multiplex the routing of emulation signals between the reconfigurable logic devices, with the at least one signal routing clock being independent of the at least one user clock. As a result, both asynchronous as well as synchronous signals may be automatically routed by the mapping software of the emulation system.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
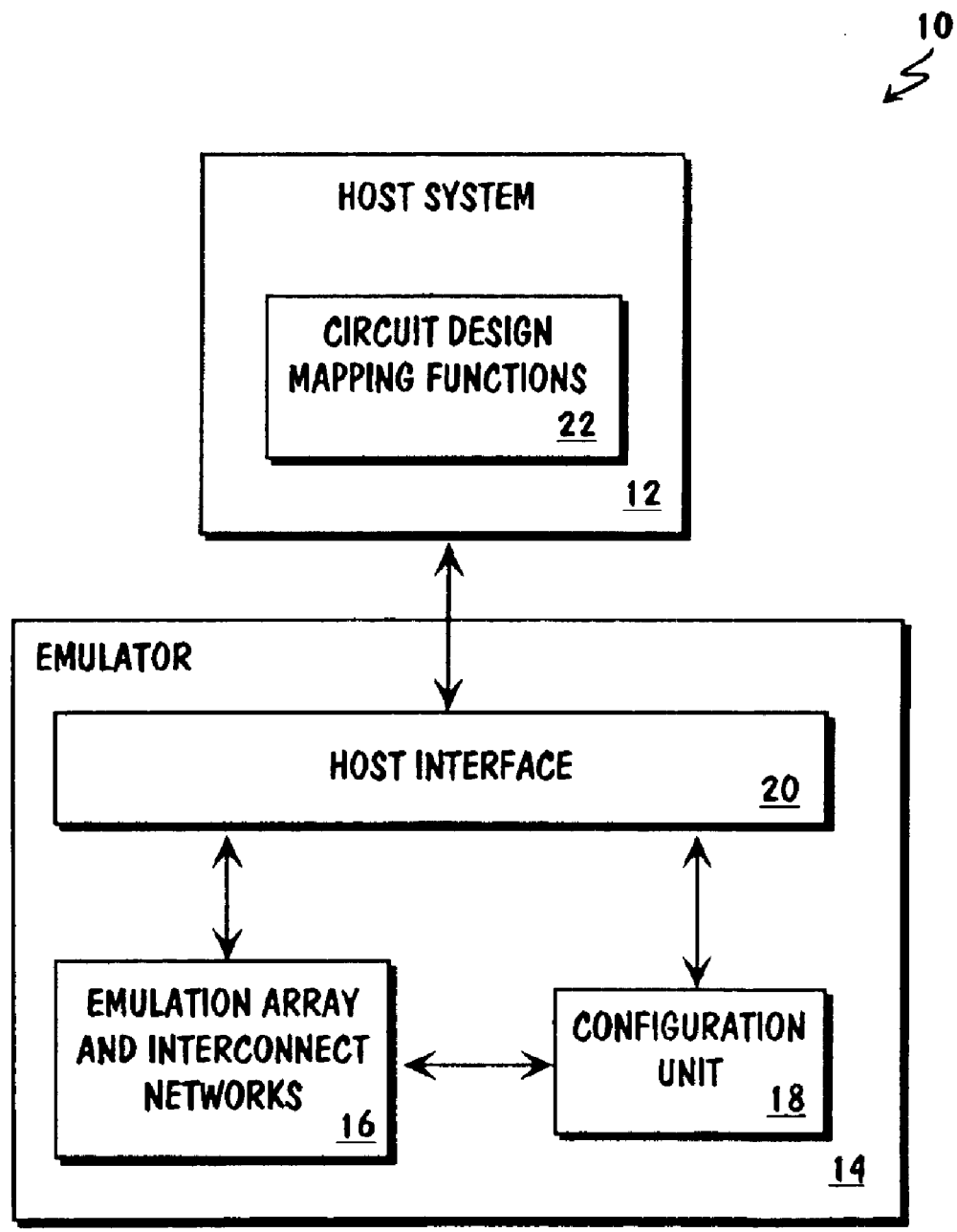
FIG. 1 is a block diagram showing an exemplary emulation system which incorporates the teachings of the present invention.

FIG. 1 is a block diagram showing an exemplary emulation system which incorporates the teachings of the present invention. As illustrated, an emulation system 10 includes host system 12 and emulator 14. Host system 12 includes in particular circuit design mapping functions 22 incorporated with the teachings of the present invention. In one embodiment, circuit design mapping functions 22 are implemented in software. In this embodiment, circuit design mapping software 22 is stored in a suitable storage medium (not shown) of host system 12, and is loaded into memory (not shown) of host system 12 for execution by a processor (not shown) of host system 12. Except for circuit design mapping functions 22, host system 12 is intended to represent a broad category of host systems found in conventional emulation systems known in the art, and thus will not be otherwise discussed further.

Emulator 14 includes emulation array and interconnect networks 16 incorporated with the teachings of the present invention, a configuration unit 18 and host interface 20 coupled to each other as shown. Except for emulation array and interconnecting network 16, emulator 14 is intended to represent a broad category of elements found in conventional emulators, whose functions and constitutions are well known to those skilled in the art, and therefore will not be otherwise further described either. As will be described in more detail below, emulation array and interconnect networks 16 comprises a number of reconfigurable logic elements (LEs) distributively packaged in a number of reconfigurable circuits and interconnected in a regional time multiplexing manner.

A particular example of an emulation array and interconnect networks 16 (suitable for incorporating the present invention) is disclosed in U.S. Pat. No. 5,574,388 to Barbier et al., which is hereby fully incorporated by reference. The manner in which regional time multiplexing is incorporated into emulation array and interconnect networks 16 will be described in more detail below.

Figure 2:
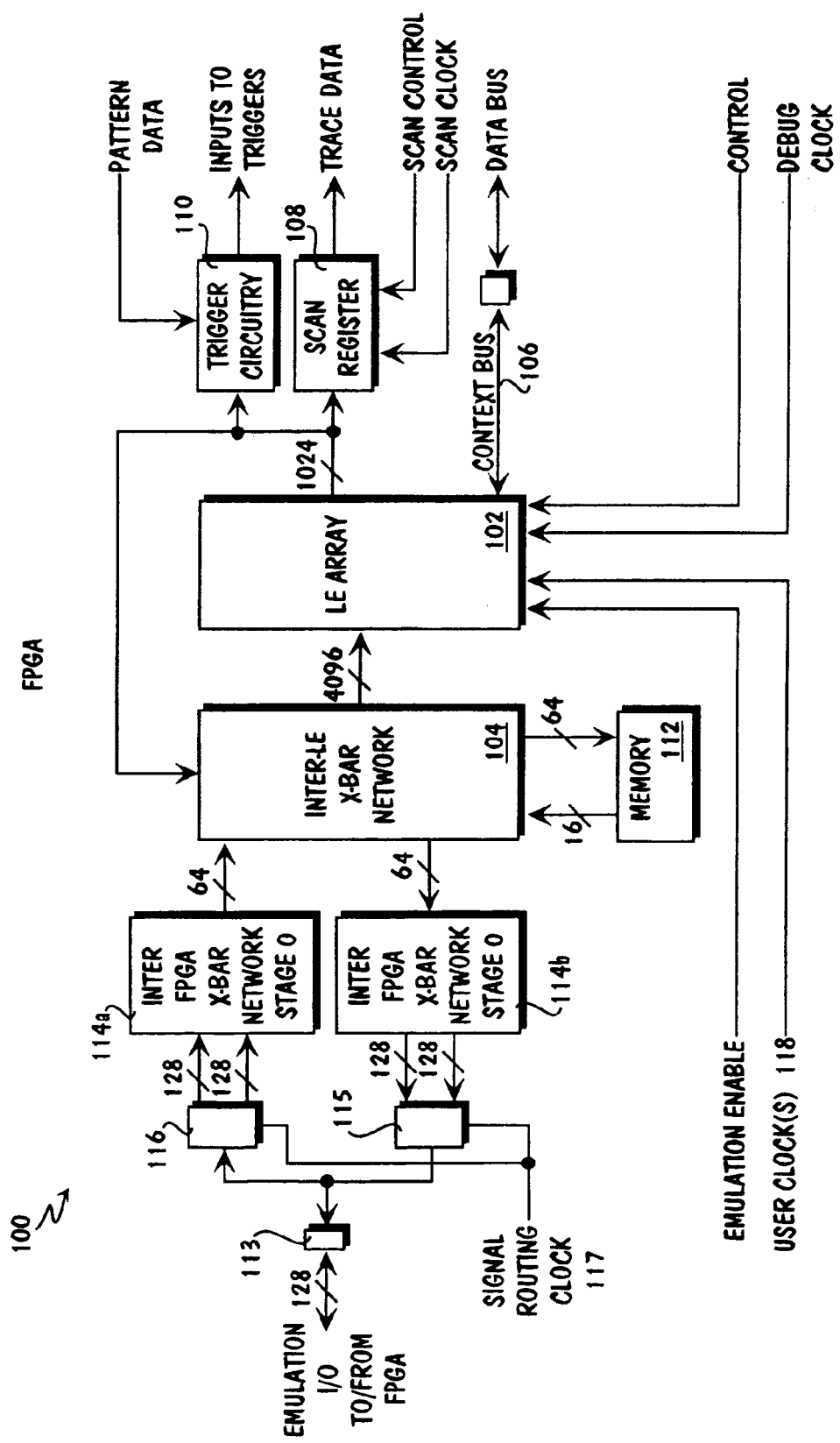
FIG. 2 is a block diagram showing an exemplary reconfigurable logic device which may be used with one embodiment of the present invention.

FIG. 2 is a block diagram showing one embodiment of a reconfigurable logic device which may be used with one embodiment of the present invention. The embodiment is of a custom or special purpose field programmable gate array (FPGA) type, hereinafter simply FPGA. For the purpose of this application, the term "FPGA" is to mean all reconfigurable circuits, and not just the typical general purpose FPGAs available in the market. FPGA 100 includes LE array 102, and buffered I/O pins 113. LE array 102 includes multiple reconfigurable LEs clocked by user clock(s) 118. As is well known in the art, the reconfigurable LEs are used to "realize" various logic elements of circuit designs, whereas, buffered I/O pins 113 are used to provide time multiplexed inputs/outputs to/from FPGA 100. Each of buffered I/O pins 113 can be statically configured to be either an input or an output pin. This static configuration can be accomplished in any of a wide variety of conventional manners, such as by way of a configuration register.

More importantly, as illustrated in FIG. 2, each of buffered I/O pins 113 is an input/output for multiple different logical inputs/outputs. In the illustrated embodiment, for ease of explanation, each buffered I/O pin 113 is an input/output for two different logical inputs/outputs, however, in alternate embodiments each buffered I/O pin 113 is an input/output for three or more different logical inputs/outputs. The logical inputs/outputs correspond to inputs to/outputs from inter-FPGA crossbar network stage 0 114a/114b. These logical inputs/outputs are time multiplexed on buffered I/O pins 113 by I/O circuitry 115, which includes a two-to-one multiplexer, and I/O circuitry 116, which includes a one-to-two demultiplexer, using signal routing clock 117. As illustrated, only 32 buffered I/O pins 113 are necessary to support the 64 logical inputs/outputs due to the two-to-one multiplexing performed by I/O circuitry 115 and 116.

As illustrated in FIG. 2, I/O circuitry 115 and 116 are clocked by signal routing clocks 117 whereas the LEs are clocked by a different clock signal (or signals), user clock(s) 118. Except for the relationship that each of signal routing clock 117 having a higher frequency than an associated user clock 118, signal routing clocks 117 are independent of user clocks 118. For the purpose of this application the "associated" user clock of a signal routing clock is the user clock employed to clock the logic elements from which the I/O signals of the I/O pins clocked by the signal routing clock originate or destined for.

In the illustrated embodiment of FIG. 2, each signal routing clock 117 is of a higher frequency than the "associated" user clock 118, thereby allowing signals to be output from FPGA 100 more frequently than they are changed internally in FPGA 100. Thus, signals can be advantageously transferred into and out of FPGA 100 asynchronously to the changing of the signals internal to FPGA 100. Typically, the frequency of the clock signal(s) in the signal routing time domain is 10 to 100 times greater than the frequency of the clock signal(s) in the user time domain. However, different embodiments may have different frequency ratios.

One embodiment of I/O circuitry 115 and 116 of each of the buffered I/O pins 113 is clocked by the same signal routing clock 117. In alternate embodiments, I/O circuitry 115 and 116 for different buffered I/O pins 113 can be clocked by different signal routing clocks rather than a single signal routing clock.

Preferably, FPGA 100 also includes memory 112, context bus 106, scan register 108, and trigger circuitry 110. Memory 112 facilitates usage of FPGA 100 to emulate circuit design with memory elements. Context bus 106, scan register 108 and trigger circuitry 110 provide on-chip integrated debugging facility for FPGA 100. These elements are described in U.S. patent application Ser. No. 08/542,838, entitled "A Field Programmable Gate Array with Integrated Debugging Facilities", which is hereby fully incorporated by reference.

Inter-LE crossbar network 104 is also integrated into FPGA 100. Inter-LE crossbar network 104 interconnects the LEs of LE array 102, memory 112, and buffered I/O pins 113 of FPGA 100, to be described more fully below.

Additionally, according to one embodiment, a corresponding portion of inter-FPGA crossbar network stage 0 114a/114b is also advantageously integrated into FPGA 100. The various portions of inter-FPGA crossbar network stage 0 114a/114b together with the remainder of inter-FPGA crossbar network interconnect FPGAs 100 of a logic board and the I/O connections of the logic board, which will also be described in more detail below.

In one embodiment, LE array 102 includes 128 reconfigurable LEs, while memory 112 uses 8-bit input and 8-bit output, and FPGA 100 has 32 buffered I/O pins 113.

Figure 3:
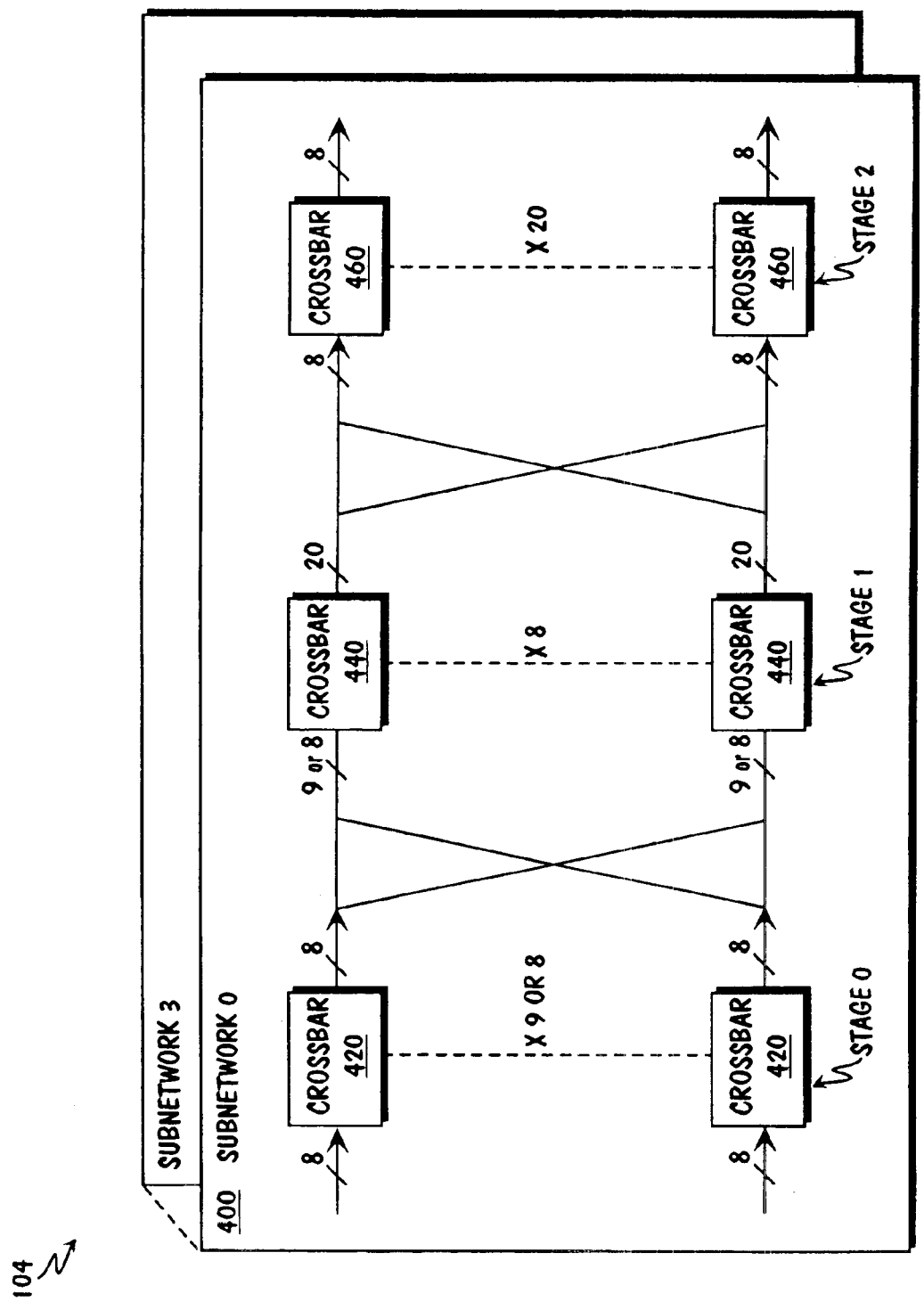
FIG. 3 is a block diagram showing an inter-LE crossbar network according to one embodiment of the present invention.

FIG. 3 is a block diagram showing an inter-LE crossbar network according to one embodiment of the present invention. For the illustrated embodiment, inter-LE crossbar network 104 includes four subnetworks of crossbars 400. A crossbar device is an interconnect device which receives multiple inputs and maps the inputs to multiple outputs of the device. Each input can be mapped to any of the multiple outputs. Which inputs are mapped to which outputs are identified by programming the crossbar device. Such crossbar devices are well known to those skilled in the art and thus will not be described further except as they pertain to the present invention.

For the illustrated embodiment, the first two subnetworks 400 are used to map 72 inputs to 160 outputs, whereas the second two subnetwork 400 are used to map 64 inputs to 160 outputs. Each subnetwork 400 comprises three stages, stage 0, stage 1, and stage 2. Stage 0 of the first two subnetworks 400 include nine 8×8 crossbars 420, whereas stage 0 of the last two of subnetworks 400 include eight 8×8 crossbars 420. In turn, stage 1 of the first two subnetworks 400 include eight 9×20 crossbars 440, whereas stage 1 of the last two subnetworks 400 include eight 8×20 crossbars 440. Stage 2 of all four subnetworks 400 include twenty 8×8 crossbars 460.

Having now described the FPGAs including the manner in which their LEs are interconnected on-chip and to the FPGA I/O pins, we now proceed to describe how the FPGAs are interconnected together on a logic board and to the logic board's I/O pins.

Figure 4:
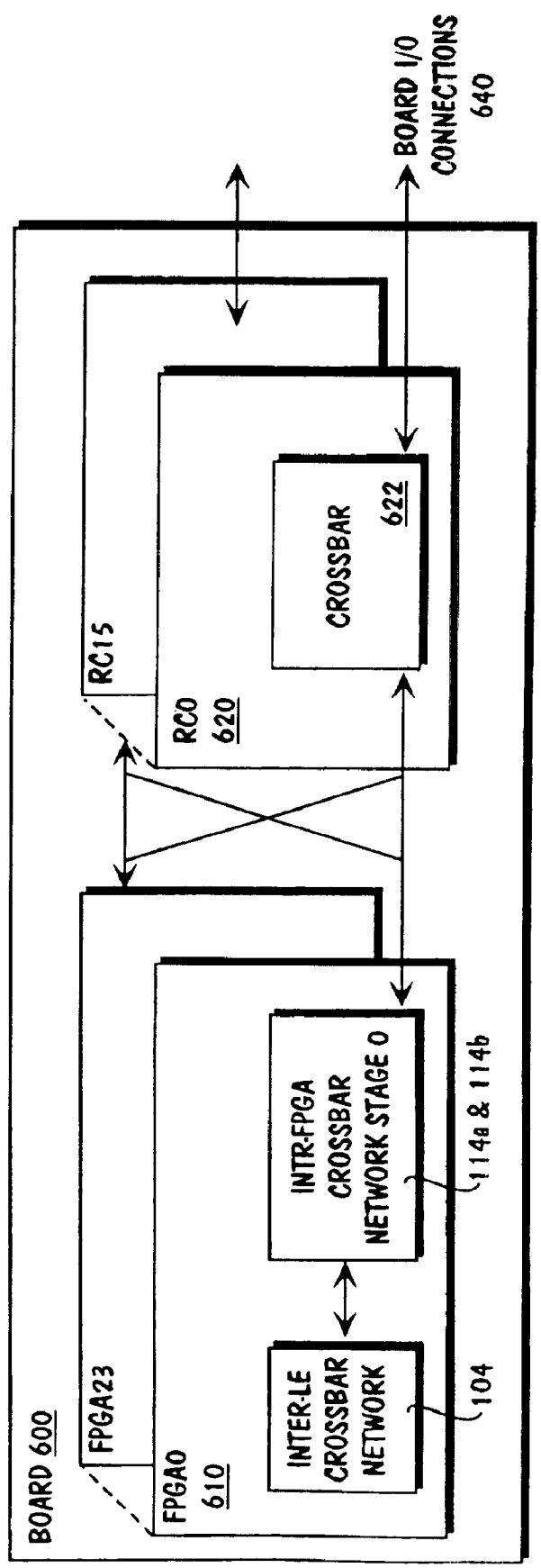
FIG. 4 is a block diagram of a circuit board which can be used in an emulator according to one embodiment of the present invention.

FIG. 4 is a block diagram of a circuit board which can be used in an emulator according to one embodiment of the present invention. A circuit board 600 is shown comprising multiple FPGAs 610 and multi-clocked routing chips (RCs) 620 coupled to each other in a "butterfly" manner as shown. In one implementation, each of the FPGAs 610 is an FPGA 100 of FIG. 2. Each multi-clocked RC 620 includes a crossbar 622 and related circuitry for supporting regional time multiplexing.

Recall from the earlier description that inter-FPGA network stage 0 is distributively implemented on FPGAs 610. Collectively, RCs 620 implement inter-FPGA network stage 1. Together, the two stages interconnect FPGAs 610 on circuit board 600 and to the I/O pins 640 of circuit board 600. (As will be discussed in more detail below, inter-FPGA network stage 1 also "doubles up" as inter-board network stage 0.)

Thus, signals output by any of the FPGAs 610 can be routed to any other FPGA 610 on circuit board 600 or routed off-board, either case, through multi-clocked RCs 620. Similarly, input signals to circuit board 600 can be routed to any one of the on-board FPGAs 610 or rerouted off-board. Each of the multi-clocked RCs 620 can advantageously operate in multiple different signal routing time domains, with one set of at least one I/O pin being clocked according to one signal routing time domain while another set of at least one I/O pin is clocked according to another signal routing time domain. Thus, the signals which are transferred into and out of multi-clocked RCs 620 are time multiplexed and different time domains can be distributed throughout different regions of the emulator. This regional time multiplexing is discussed in more detail below.

In the embodiment shown, board 600 includes twenty-four FPGAs 610 and sixteen RCs 620. However, it is to be appreciated that alternate embodiments can include different numbers of FPGAs and RCs.

Figure 5:
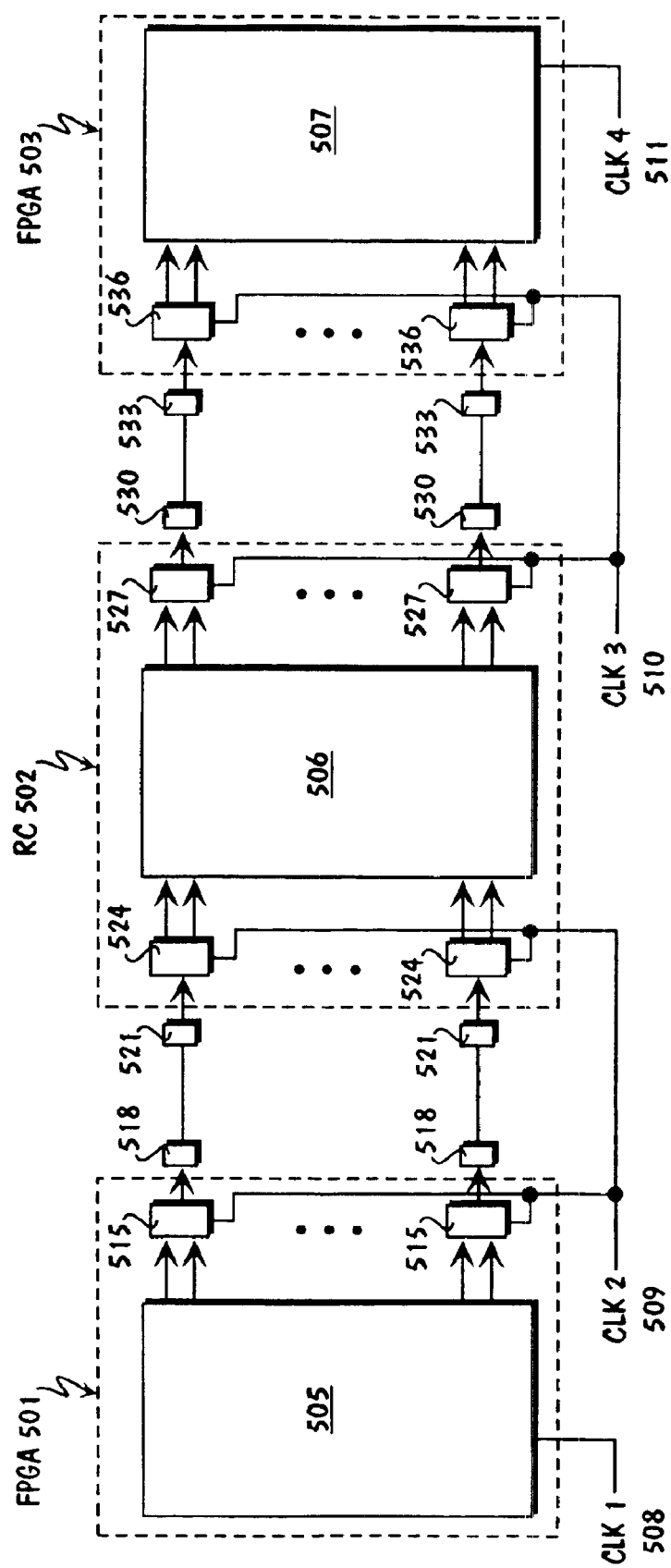
FIG. 5 is a block diagram illustrating the concept of regional time multiplexing according to one embodiment of the present invention.

FIG. 5 is a block diagram illustrating the concept of regional time multiplexing according to one embodiment of the present invention. Two FPGAs 501 and 503 and a multi-clocked RC 502 are illustrated. In the illustrated embodiment, FPGAs 501 and 503 are both FPGAs 100 of FIG. 2, and can be situated on the same or different boards 600 of FIG. 4. It is to be appreciated that, depending on their locations within the emulator, additional multi-clocked RCs 502 may be needed to route signals between FPGAs 501 and 503. For ease of illustration, the internal circuitry of FPGAs 501 and 503 are shown as blocks 505 and 507, and are intended to represent the reconfigurable logic elements, inter-logic element crossbar network and inter-FPGA crossbar network stage 0, as well as other internal circuitry, of the FPGAs as illustrated in FIG. 2.

As illustrated, the internal circuitry of FPGA 501 is clocked in a user time domain by clock signal 508 (clk1), whereas the I/O circuitry 515 for the input/output of signals is clocked in a signal routing time domain by clock signal 509 (clk2). As discussed above, except for clock signal 509 (clk2) being of a higher frequency than clock signal 508, clock signals 508 and 509 (clk2) are independent of one another.

The output signals from the internal circuitry 505 of FPGA 501 are input to two-to-one multiplexers of I/O circuitry 515 and output from FPGA 501 via pins 518. Input signals to RC 502 are received on I/O pins 521 and provided to I/O circuitry 524 where the signals are demultiplexed and input to static routing circuitry 506 of RC 502. The outputs of static routing circuitry 506 are provided to I/O circuitry 527. Each of I/O circuitry 527 also includes a two-to-one multiplexer, providing an output signal to one of the I/O pins 530. The output signals are routed to I/O pins 533 of FPGA 503, and then demultiplexed by demultiplexers of I/O circuitry 536 and input to internal circuitry 507 of FPGA 503.

In the illustrated embodiment, static routing circuitry 506 of FIG. 5 is a crossbar 622 of FIG. 4. Static routing circuitry 506 is configured to route particular inputs to particular outputs as part of the programming process of the emulator. Given the static nature of circuitry 506, the circuitry 506 is not clocked.

As illustrated in FIG. 5, internal circuitry 505 of FPGA 501 is clocked in a user time domain by clock signal 508 (clk1), multiplexers 515 and demultiplexers 524 are clocked in a signal routing time domain by clock signal 509 (clk2), multiplexers 527 and demultiplexers 536 are clocked in another signal routing time domain by clock signal 510 (clk3), and internal circuitry 507 of FPGA 503 is clocked in another user time domain by clock signal 511 (clk4).

Thus, two user time domains and two signal routing time domains are illustrated in FIG. 5, as clocked by clock signals 508, 509, 510, and 511. As illustrated, different sets of I/O pins and related I/O circuitry of RC 502 are clocked by different clock signals. Thus, signals can be advantageously transferred out of RC 502 asynchronously to the input of signals to RC 502 by outputting the signals from a different set than the signals were input on. In an alternate embodiment of the present invention, user clock signals 508 and 511 are the same clock signal. Thus, in this alternate embodiment, internal circuitry 505 and 507 are both in the same time domain.

In an alternate embodiment of the present invention, signals are routed directly from I/O pins 518 of FPGA 501 to/from I/O pins 533 of FPGA 503 without being routed through RC 502. I/O circuitry 515 and 536 are both clocked by one of either signal routing clock 509 or signal routing clock 510. Thus, even though a routing chip is not used in this alternate embodiment, the signal routing between FPGAs is still clocked by a signal independent of the user clock signal(s).

Thus, FIG. 5 illustrates regional time multiplexing in which two different signal routing time domains are distributed throughout the emulator. As illustrated, different regions of the emulator are clocked according to different signal routing time domain clock signals. It is to be appreciated that additional signal routing time domains (not shown) can also be distributed throughout the emulator.

In an alternate embodiment of the present invention, signals are routed directly from I/O pins 510 of FPGA 501 to/from I/O pins 533 of FPGA 503 without being routed through RC 502. I/O circuitry 515 and 536 are both clocked by one of either signal routing clock 509 or signal routing clock 510. Thus, even though a routing chip is not used in this alternate embodiment, the signal routing between FPGAs is still clocked by a signal independent of the user clock signal(s).

In another alternate embodiment of the present invention, signal routing clock 509 and signal routing clock 510 are the same clock signal. Thus, although all inputs/outputs of the RC 502 are clocked by the same signal routing clock signal in this alternate embodiment, the signal routing clock 510 is still independent of the user clocks 508 and 511. Thus, information can still be input to/output from FPGAs asynchronously to the changing of signals within the internal circuitry of the FPGAs.

Figure 6:
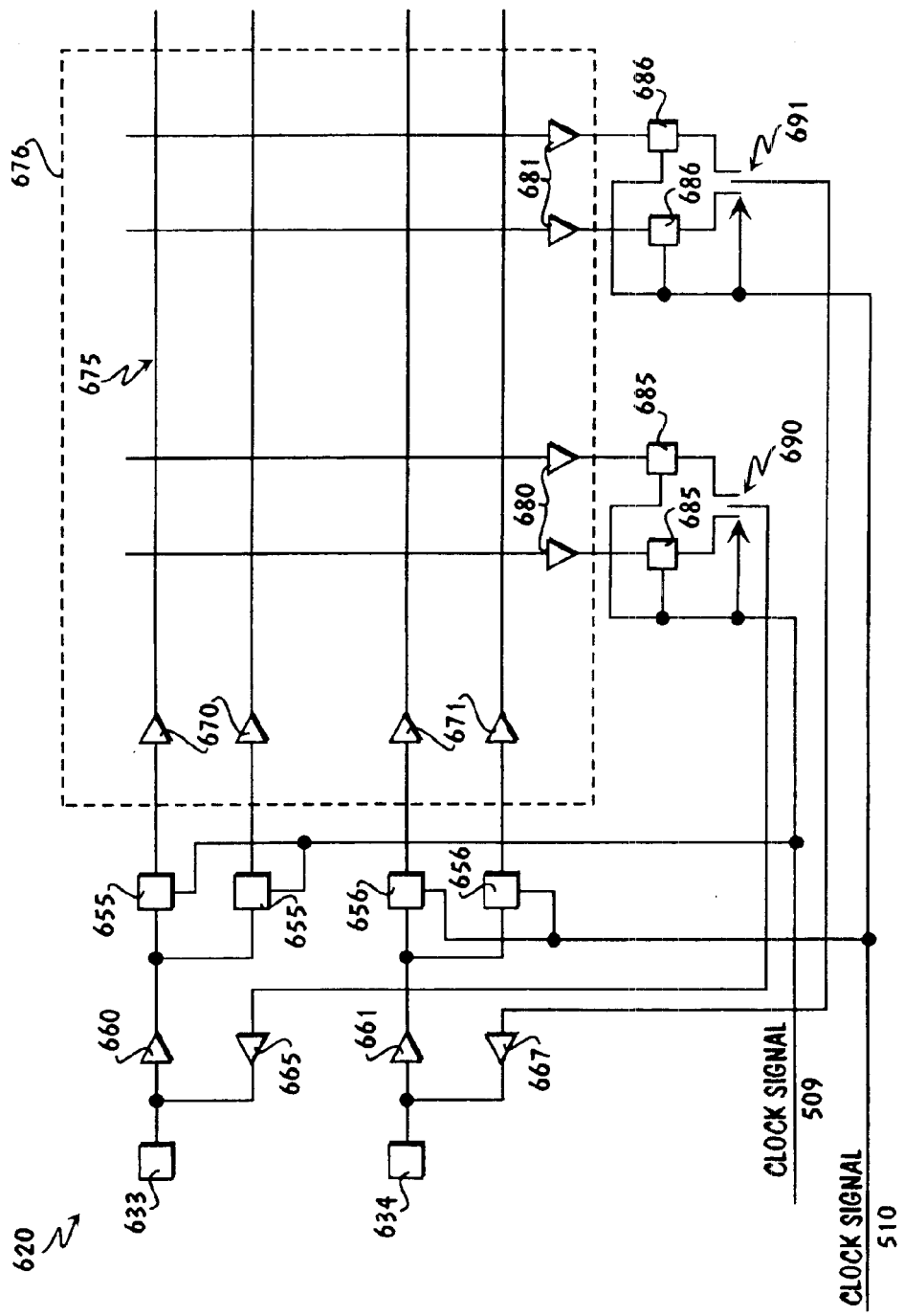
FIG. 6 is a block diagram showing one embodiment of a multi-clocked routing chip suitable for use with one embodiment of the present invention.

FIG. 6 is a block diagram showing one embodiment of a multi-clocked RC 620 suitable for use in circuit board 600 in more detail. For ease of explanation, only two I/O pins 633 and 634 and associated circuitry are illustrated in FIG. 6. It is to be appreciated that the remaining I/O pins of RC 620 have similar associated circuitry. I/O pin 633 is enabled as either an input or an output by driver 660 and driver 665. Driver 660 is enabled if I/O pin 633 is to be an input, and driver 665 is enabled if I/O pin 633 is to be an output. When operating as an input, signals received on pin 633 are provided to latches 655, which latch in the value on pin 633 on the falling edge of clock signal 509. These latched signals will be input to the interconnect 675 by drivers 670. The enablement of driver 660 or driver 665 is performed as part of the programming of the emulator.

Outputs from RC 620 via I/O pin 633 are controlled by latches 685 and switch 690. Outputs from interconnect 675 are provided to latches 685 via drivers 680. Latches 685 are clocked by clock signal 509 and latch in a value from their respective drivers 680 on the rising edge of clock signal 509. The outputs of latches 685 are provided to switch 690, which is also controlled by the rising edge of clock signal 509. The latched value from one of the latches 685 is output by switch 690, as controlled by clock signal 509.

Similarly, I/O pin 634 is enabled as either an input or an output by driver 661 and driver 667. Driver 661 is enabled if I/O pin 634 is to be an input, and driver 667 is enabled if I/O pin 634 is to be an output. When operating as an input, signals received on pin 634 are provided to latches 656, which latch in the value on pin 634 on the falling edge of clock signal 510. These latched signals will be input to the interconnect 675 by drivers 671.

Outputs from RC 620 via I/O pin 634 are controlled by latches 686 and switch 691. Outputs from interconnect 675 are provided to latches 686 via drivers 681. Latches 686 are clocked by clock signal 510 and latch in a value from their respective drivers 681 on the rising edge of clock signal 510. The outputs of latches 686 are provided to switch 691, which is also controlled by the rising edge of clock signal 510. The latched value from one of the latches 686 is output by switch 691, as controlled by clock signal 510.

In the embodiment illustrated in FIG. 6, driver 670, driver 680 and interconnect 675 are referred to as the "static" part of RC 620, denoted by dashed box 676. The static part of RC 620 does not operate based on clock signals, so signals can be sampled out of the static part without regard for the clock frequency at which they were sampled in. Similarly, latches 655 and 685, drivers 660 and 665, and switch 690 are referred to as the "dynamic" part of RC 620.

Thus, as illustrated in FIG. 6, two different inputs/outputs of RC 620 are operating in two different signal routing time domains, clocked by two different clock signals. This separation advantageously allows time domains to be changed by simply routing through an RC 620. In other words, a signal can be input to RC 620 via I/O pin 633 in the time domain clocked by clock signal 509, and output from RC 620 via I/O pin 634 in the time domain clocked by clock signal 510.

In an alternate embodiment of the present invention, the latches 685 and 686 are not included, and the output of drivers 680 and 681 are input directly to switches 690 and 691, respectively. In this alternate embodiment, an additional latch (not shown), clocked by clock signal 509, is situated between switch 690 and driver 665, and another latch (not shown), clocked by clock signal 510, is situated between switch 690 and driver 667.

According to one embodiment of the present invention, RC 620 is clocked by two different signal routing clock signals, and the I/O pins are grouped in different sets, with each set being clocked in a different signal routing time domain. According to one implementation, the I/O pins on one side of RC 620 are part of a first set while the I/O pins on the other side of RC 620 are part of a second set.

According to alternate embodiments of the present invention, additional sets of I/O pins of RC 620 are clocked according to additional clock signals. A set of I/O pins can include a number of pins ranging from one to (x−1) where x is equal to the total number of I/O pins on RC 620. Each of these different sets is clocked in a different time domain. An RC 620 can support up to x different signal routing time domains at any one time.

Figure 7A:
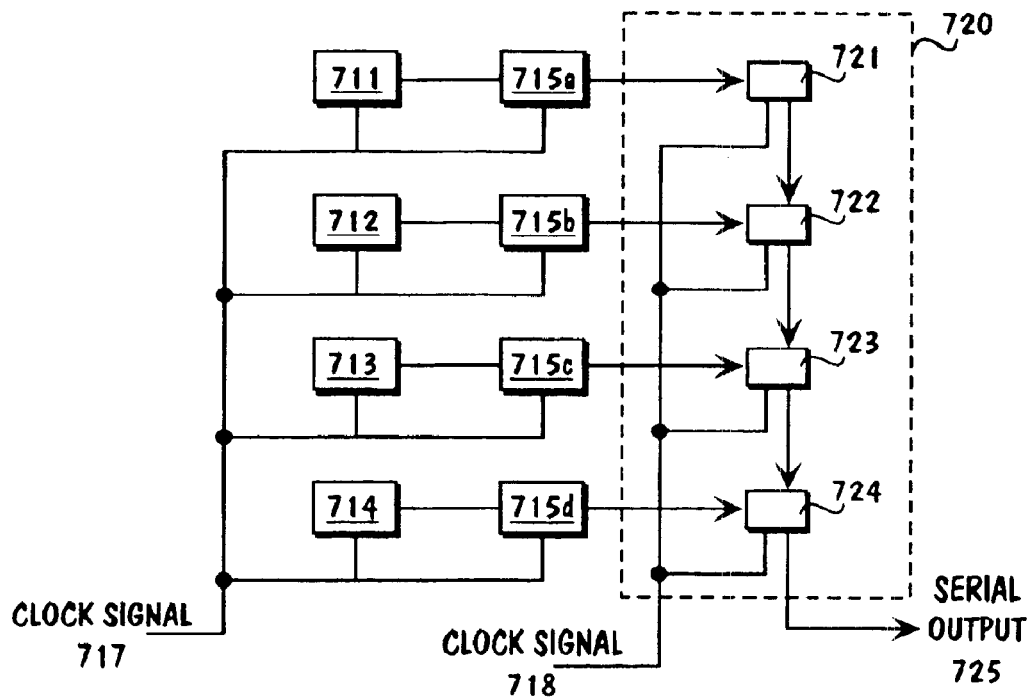
FIGS. 7a and 7b are block diagrams illustrating shift registers which may be used to support the regional time multiplexing according to one embodiment of the present invention.
Figure 7B:
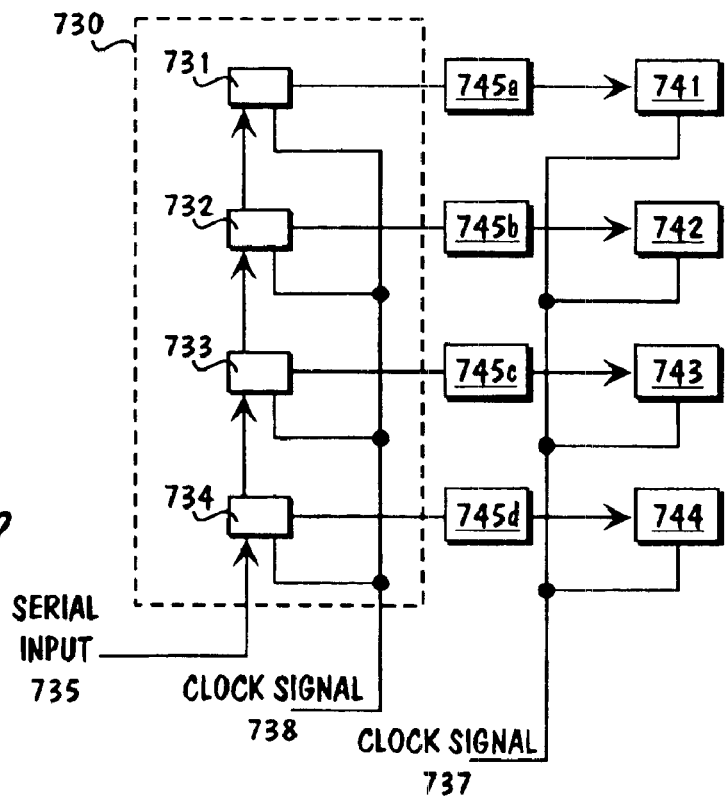

In the illustrated embodiment, multiplexers and demultiplexers are used to support the regional time multiplexing of the present invention. Alternate embodiments of the present invention can utilize any of a wide variety of conventional mechanisms for sharing of a single physical signal by multiple logical signals. FIGS. 7a and 7b illustrate one such alternate embodiment.

FIG. 7a is a block diagram illustrating an output register which may be used to support the regional time multiplexing according to one embodiment of the present invention. A parallel input, serial output shift register 720 is illustrated including four register cells 721, 722, 723, and 724. Inputs to register 720 are from internal circuitry 711, 712, 713, and 714 through latches 715a–715d. Internal circuitry 711, 712, 713, and 714 can be any of a wide range of circuitry. Internal circuitry 711, 712, 713, and 714 and latches 715a–715d are clocked by internal clock signal 717, and register 720 is clocked by time multiplexing clock signal 718. Data is input to cells 721, 722, 723, and 724 in parallel, then shifted out serially as serial output 725 starting with cell 724. Thus, four logical internal signals, received from internal circuitry 711, 712, 713, and 714, are output via a single output signal 725. In the illustrated embodiment, clock signal 718 has a frequency four times that of clock signal 717. Thus, every clock signal 717 cycle a new set of four data signals can be transferred to register 720, with one signal being shifted out of register 720 every clock signal 718 cycle.

FIG. 7*b* is a block diagram illustrating an input register which may be used to support the regional time multiplexing according to one embodiment of the present invention. A serial input, parallel output shift register 730 is illustrated including four cells 731, 732, 733, and 734. Inputs to shift register 730 are shifted in serially from serial input 735, with input data shifting from cell 734 up to cell 731. In the illustrated embodiment, clock signal 738 has a frequency four times that of clock signal 737. Thus, every clock signal 737 cycle a new set of four data signals can be transferred from register 730 to internal circuitry 741, 742, 743, and 744 through latches 745*a*–745*d*. Internal circuitry 741, 742, 743, and 744 can be any of a wide range of circuitry.

Figure 8:
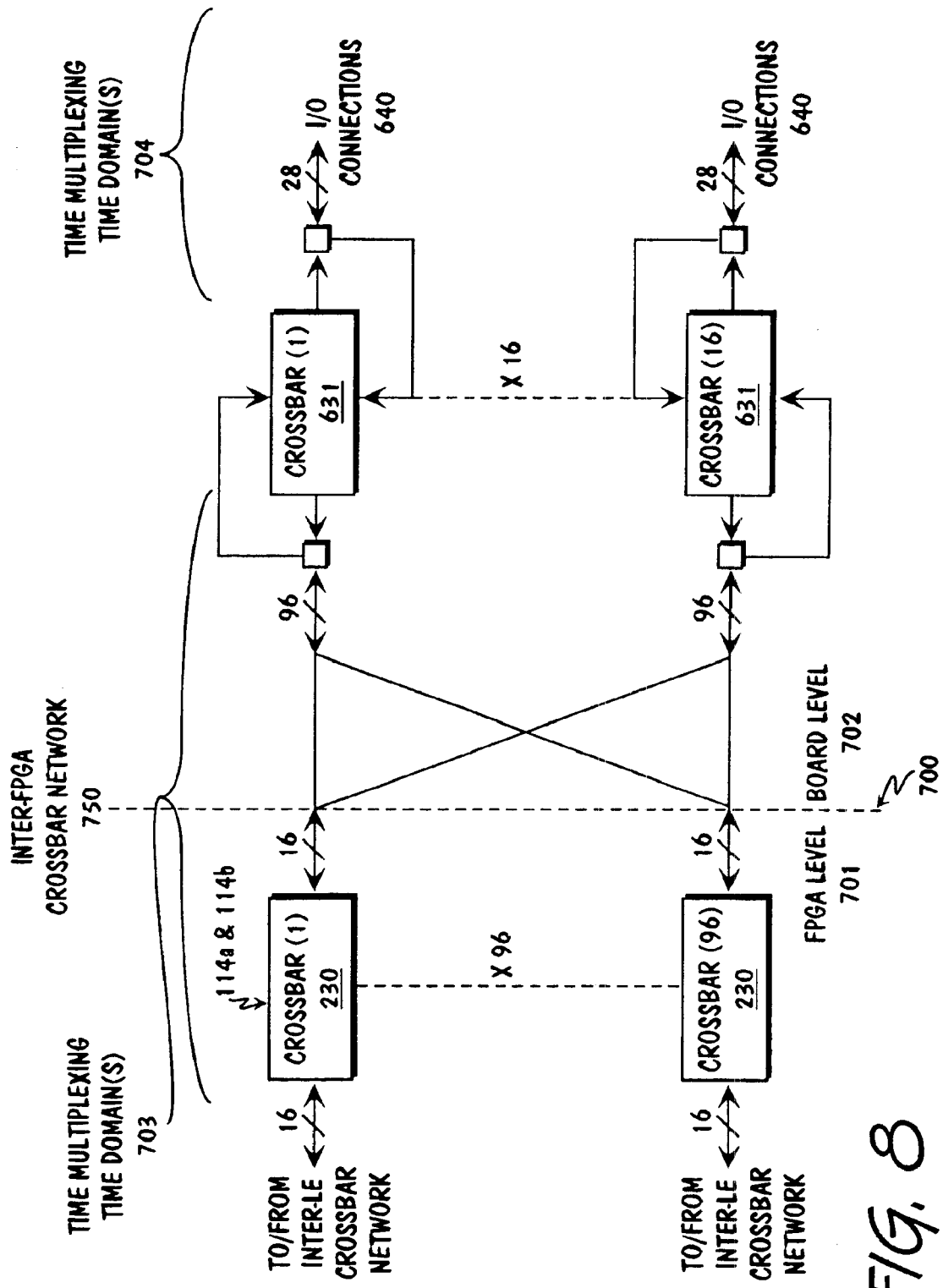
FIG. 8 is a block diagram showing a logical view of an inter-reconfigurable logic device crossbar network according to one embodiment of the present invention.

FIG. 8 is a block diagram showing a logical view of an inter-FPGA crossbar network according to one embodiment of the present invention. As described earlier, the inter-FPGA crossbar network 750 interconnects the FPGAs on a circuit board such that signals can be routed between any of the FPGAs on the circuit board. In addition, the inter-FPGA crossbar network 750 also interconnects the FPGAs to the circuit board I/O connections so that signals can be routed between the circuit board I/O connections and the FPGAs. The interconnection of logical signals is illustrated in FIG. 8. As discussed above, the actual physical transfer of these signals is performed using the regional time multiplexing of the present invention.

The routing of signals in the inter-FPGA crossbar network 750 spans both the FPGA level and the circuit board level. A division line 700 is shown in FIG. 8 which identifies a separation between FPGA level 701 and board level 702. Crossbars 230 (corresponding to stage 114*a*–/114*b*) is implemented in FPGA 610 of FIG. 4. The second stage of the inter-FPGA crossbar network, however, is implemented in the board level 702. I/O signals (16) from each of the four crossbars 230 of the 24 FPGAs (4×24=96) I/O coupled to the "FPGA-side" of the 16 RCs 631. On the "board-side" of 16 RCs 631, 28×16=448 signals are coupled to and from the logic board's I/O connections 640.

Multiple signal routing time domains are also illustrated in FIG. 8. The outputs of the FPGAs, from crossbars 230, are in signal routing time domain(s) 703. As discussed above, different sets of I/Os from an FPGA, or different FPGAs, can be in different signal routing time domains. Similarly, the RCs 631 are in signal routing time domain(s) 704. As discussed above, different sets of I/Os from an RC, or different RCs, can be in different signal routing time domains.

For the above described embodiment, wherein there are 24 FPGAs 610, each having 64 I/O connections, disposed on circuit board 600, having 448 I/O connections, a total of {(24×64)+448} or {1536+448} are interconnected together by inter-FPGA crossbar network 750.

Figure 9:
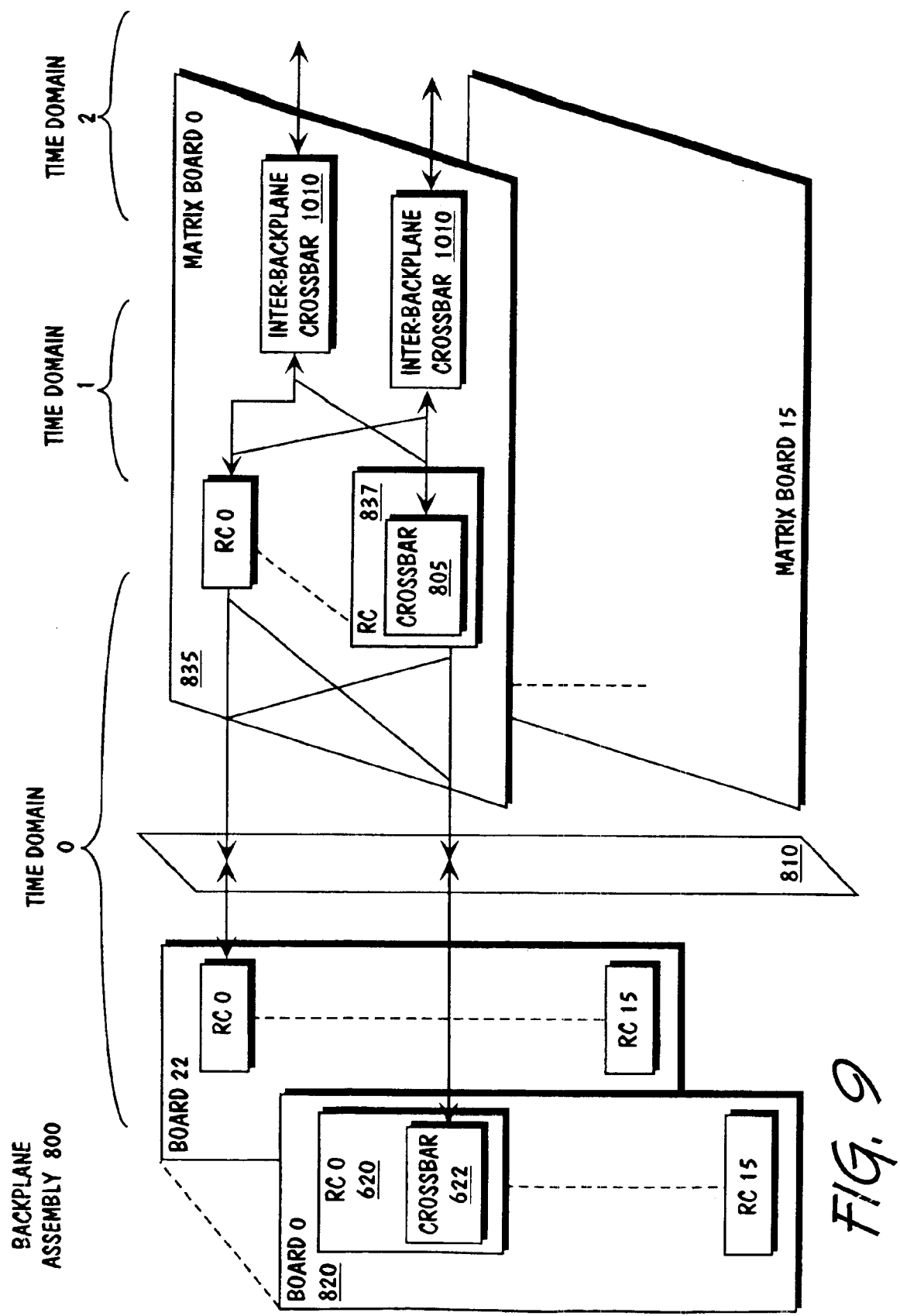
FIG. 9 is a block diagram of a backplane assembly according to one embodiment of the present invention.

FIG. 9 is a block diagram of a backplane assembly according to one embodiment of the present invention. Backplane assembly 800 is used to interconnect circuit boards 820. Circuit boards 820 may be logic boards 600 of FIG. 4 or I/O boards for interfacing with external devices. In other words, backplane assembly 800 is used to interconnect FPGAs disposed on logic boards 600 with each other and with external devices. Backplane assembly 800 comprises backplane 810 and a number of matrix boards 835. Backplane 810 is used to accept circuit boards 820, whereas matrix boards 835 are used to interconnect signals to and from the various circuit boards 820.

Recall from earlier descriptions that inter-FPGA crossbar network stage 1 also "doubles up" as inter-board crossbar network stage 0. Collectively, the 16 sets of 28 RCs 805 implement inter-board crossbar network stage 1. Together, the two stages implement the inter-board crossbar network. As discussed above, different sets of I/Os of the RCs 620 and 837 can be in different time domains. Additionally, each of the crossbar 1010 inputs/outputs can be configured with the regional time multiplexing circuitry of the present invention.

Figure 10:
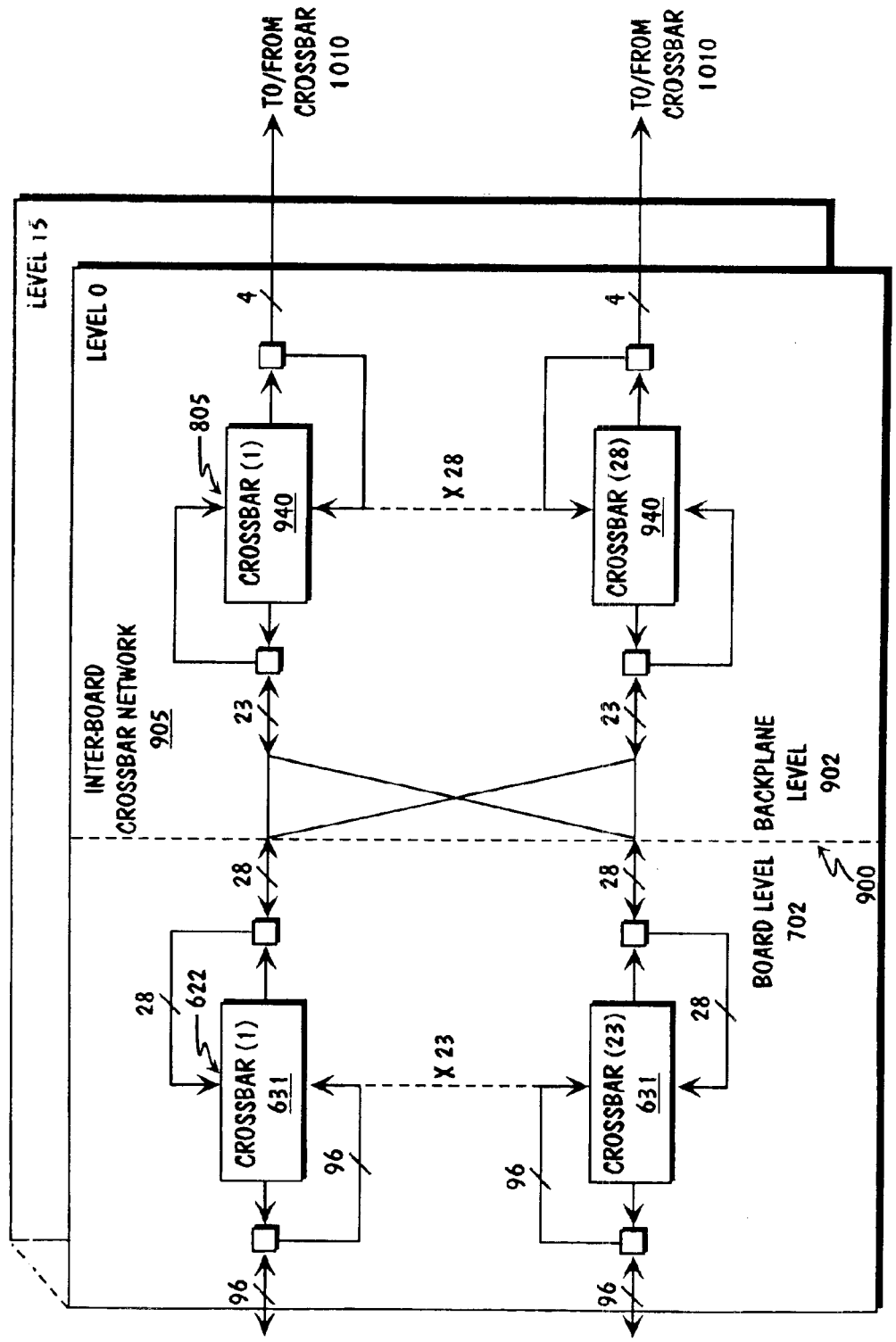
FIG. 10 is a block diagram illustrating a logical view of an inter-board crossbar network according to one embodiment of the present invention.

FIG. 10 is a block diagram illustrating a logical view of an inter-board crossbar network according to one embodiment of the present invention. As described earlier, inter-board crossbar network 905 spans two physical form levels, i.e. board level 702 and backplane level 902 separated by dotted line 900. As shown, for the illustrated embodiment, stage 0 comprises 23 124×124 crossbars 631, each having 28 board I/O connections, whereas stage 1 comprises 28 27×27 crossbars 940, each having 23 "board-side" I/O connections. The 28 board I/O connections of the 23 crossbars 631 and the 23 "board-side" I/O connections of the 28 crossbars 940 are connected to each other in a "butterfly" manner. Additionally, each crossbar 940 also has 4 "crate-side" I/O connections. The interconnection of logical signals is illustrated in FIG. 10. As discussed above, the actual physical transfer of these signals is performed using the regional time multiplexing of the present invention.

Figure 11:
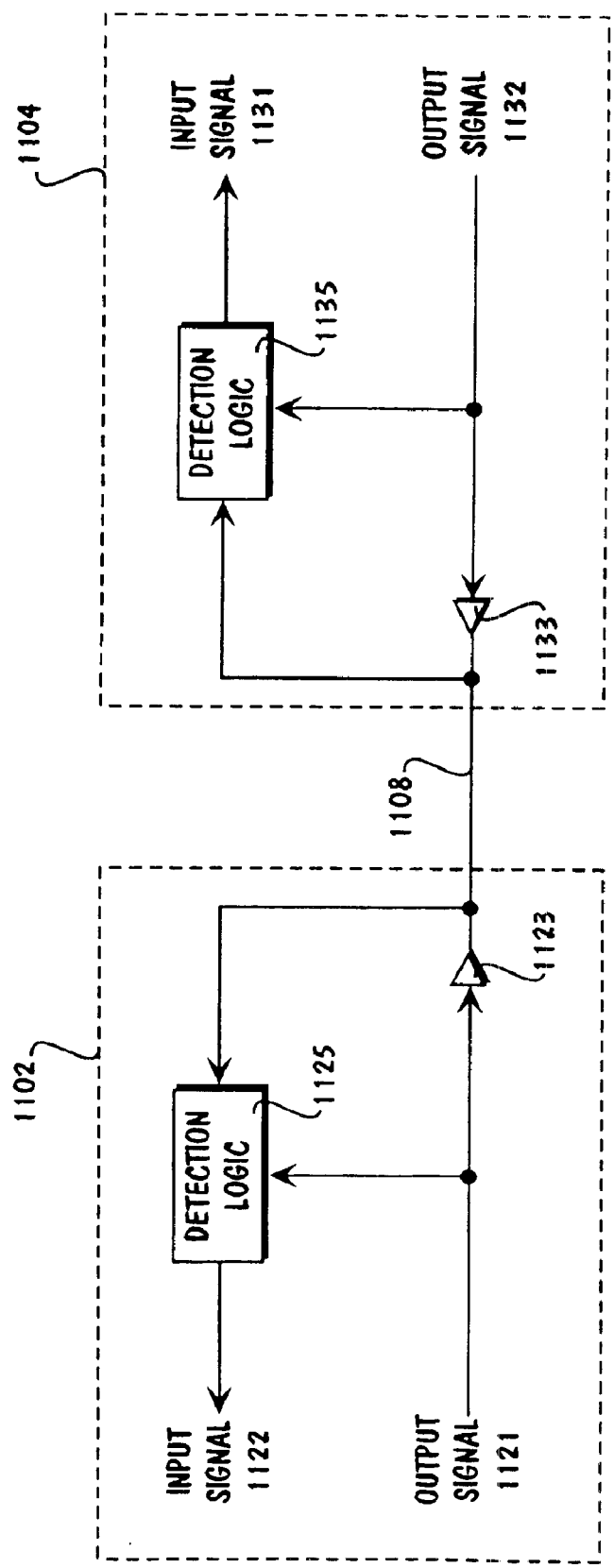
FIG. 11 is a block diagram illustrating the concurrent bi-directional data transfer over a single connection according to one embodiment of the present invention.

Signals are transferred between two chips of the emulator described above via physical connections between those chips. According to one embodiment of the present invention, each of the physical connections allows for concurrent bi-directional data transfer. FIG. 11 is a block diagram illustrating the concurrent bi-directional data transfer over a single connection according to one embodiment of the present invention. As illustrated, two chips 1102 and 1104 are connected via a connection 1108. Connection 1108 is intended to represent a wide range of conventional connection media, including both wires and circuit board traces. According to one embodiment of the present invention, the FPGAs and RCs discussed above are connected together analogously to chips 1102 and 1104. For ease of explanation, only a single connection between two chips is illustrated. It is to be appreciated that additional signals can also be transferred between the chips in an analogous manner.

Chips 1102 and 1104 can simultaneously transfer signals to each other via connection 1108. Chips 1102 and 1104 each include I/O circuitry, including a driver and a detection logic as illustrated. An output signal 1121 to be output by chip 1102 is driven onto connection 1108 via driver 1123. Concurrently, an output signal 1132 to be output by chip 1104 is driven onto connection 1108 via driver 1133. After the signals are driven onto connection 1108, detection logics 1125 and 1135 each sample the voltage level of connection 1108. Based on the sampled voltage level of connection 1108, as well as possibly the output signal 1132, detection logic 1135 provides an input signal 1131 to the internal circuitry of chip 1104 which is representative of output signal 1121 driven by chip 1102. Similarly, based on the sampled voltage level of connection 1108, as well as possibly the output signal 1121, detection logic 1125 provides an input signal 1122 to the internal circuitry of chip 1102 which is representative of output signal 1132 driven by chip 1104.

As is well-known to those skilled in the art, driving a particular value onto a connection is done by asserting a particular voltage level on the connection. A value of a logical zero is typically in the range of 0.0 volts to 0.5 volts, and the value of a logical one is typically in the range of 1.8 volts to 2.4 volts. Detection logics 1125 and 1135 use these voltage ranges in part to determine the value being driven by the other chip according to the following procedure. If the voltage level of connection 1108 is less than 0.5 volts, then both chips were driving a logical zero. If the voltage level of connection 1108 is greater than 1.8 volts, then both chips were driving a logical one. However, if the voltage level is between 0.5 volts and 1.8 volts, then one of the chips was driving a logical zero while the other was driving a logical one. As illustrated, detection logics 1125 and 1135 both receive as inputs the output signals being driven by their respective chips. According to the present invention, detection logic 1125 can, in the situation of a voltage level on connection 1108 between 0.5 volts and 1.8 volts, conclude that the signal output by chip 1104 is the inverse of the signal being output by chip 1102. Similarly, detection logic 1135 can, in the situation of a voltage level on connection 1108 between 0.5 volts and 1.8 volts, conclude that the signal output by chip 1102 is the inverse of the signal being output by chip 1104.

Thus, a single physical connection between two chips can be used to simultaneously transfer signals bi-directionally between those chips.

In the discussions above the regional time multiplexing is described as using two-to-one multiplexing, with two logical connections corresponding to one physical connection. Alternate embodiments of the present invention can use different numbers of inputs and outputs for the multiplexing, with m physical connections corresponding to n logical connections, where n>m, using an n to m multiplexer.

In the discussion above, the emulator is described as including multiple FPGAs. In alternate embodiments, other reconfigurable logic devices are used in the emulator rather than FPGAs.

Also in the discussions above, reference is made to chips which include pins. It is to be appreciated that the present invention can also be practiced in embodiments where chips do not include pins, such as where chips are surface mounted to circuit boards.

Thus, by separating the emulator into different regions, each being a separate time domain, asynchronous logic may be emulated without hard-wiring asynchronous signals to dedicated pins. Additionally, the problem of synchronizing clock signals is advantageously reduced, regardless of the overall size of the emulator. By not requiring the same clock signal to be routed throughout the entire system, the clock signals in the emulator no longer need to be synchronized across such a large area.

While the emulation system of the present invention has been described in terms of the above illustrated embodiments, those skilled in the art will recognize that the invention is not limited to the embodiments described. The present invention can be practiced with modification and altercation within the spirit and scope of the appended claims. The description is thus regarded as illustrative instead of restrictive on the present invention.

What is claimed is:

1. An emulation system comprising:
   a first plurality of reconfigurable logic devices;
   a second plurality of reconfigurable logic devices;
   a third plurality of reconfigurable logic devices;
   a first time multiplexed interconnection coupled to and situated between the first plurality of reconfigurable logic devices and the second plurality of reconfigurable logic devices; and
   a second time multiplexed interconnection coupled to and situated between the second plurality of reconfigurable logic devices and the third plurality of reconfigurable logic devices, wherein clocking of the second time multiplexed interconnection is independent of clocking of the first time multiplexed interconnection.

2. The emulation system of claim 1, wherein each of the first plurality of reconfigurable logic devices, each of the second plurality of reconfigurable logic devices, and each of the third plurality of reconfigurable logic devices is a field programmable gate array.

3. The emulation system of claim 1, wherein the first time multiplexed interconnection includes a first set of input/output circuitry of a multi-clocked routing chip and the second time multiplexed interconnection includes a second set of input/output circuitry of the multi-clocked routing chip.

4. The emulation system of claim 1, wherein the first time multiplexed interconnection includes a first plurality of multiplexers and demultiplexers, and the second time multiplexed interconnection includes a second plurality of multiplexers and demultiplexers.

5. An emulator for emulating a circuit design, comprising:
   a first reconfigurable logic device that includes a first plurality of reconfigurable logic elements and first input/output circuitry;
   a second reconfigurable logic device that includes a second plurality of reconfigurable logic elements and second input/output circuitry;
   a first clock signal for clocking the first plurality of reconfigurable logic elements;
   a second clock signal for clocking the second plurality of reconfigurable logic elements; and
   at least one signal routing clock signal for clocking at least one of the first input/output circuitry and the second input/output circuitry, wherein the signal routing clock signal is independent of the first clock signal and the second clock signal.

6. An emulator according to claim 5, wherein the first reconfigurable logic device is a field programmable gate array.

7. An emulator according to claim 6, wherein the second reconfigurable logic device is a field programmable gate array.

8. An emulator according to claim 5, wherein the first clock signal and the second clock signal are the same clock signal.

9. An emulator according to claim 5, wherein said at least one signal routing clock signal includes a first signal routing clock signal for clocking the first input/output circuitry and a second signal routing clock signal for clocking the second input/output circuitry, wherein the first signal routing clock signal is different from the second signal routing clock signal.

10. An emulator according to claim 5, further comprising:
    at least one interconnect device interconnecting the first reconfigurable logic device and the second reconfigurable logic device, wherein said interconnect device includes a first input/output portion and a second input/output portion, wherein the first input/output circuitry and the first input/output portion are clocked by a first signal routing clock signal, and wherein the second input/output circuitry and the second input/output portion are clocked by a second signal routing clock signal.

11. An emulator according to claim 10, wherein said at least one interconnect device includes a plurality of multiplexers for time multiplexing data transfers to and from another interconnect device.

12. An emulator according to claim 10, wherein signals are transferred out of said interconnect device asynchronously to transfer of signals into said interconnect device.

13. An emulator according to claim 5, further comprising:
a third reconfigurable logic device clocked at least in part by a third clock signal that is different from the first clock signal and the second clock signal.

14. An emulator according to claim 5, further comprising:
a first interconnect device interconnecting the first reconfigurable logic device and the second reconfigurable logic device; and
a bi-directional data transfer connection situated between the first reconfigurable logic device and the first interconnect device, wherein the bi-directional data transfer connection provides simultaneous bi-directional data transfer between the first reconfigurable logic device and the first interconnect device via a single wire or trace.

15. An emulator according to claim 14, wherein the first reconfigurable logic device includes detection logic for determining a signal value asserted by the first interconnect device based at least in part on a voltage level of the bi-directional data transfer connection.

16. An emulator according to claim 15, wherein the detection logic determines the signal value asserted by the first interconnect device further based at least in part on a signal value asserted by the first reconfigurable logic device.

17. An emulator according to claim 5, further comprising:
a first set of input/output pins connected to the first input/output circuitry for transferring signals to and from the first reconfigurable logic device; and
a second set of input/output pins connected to the second input/output circuitry for transferring signals to and from the second reconfigurable logic device.

18. An emulator according to claim 5, wherein signals can be transferred into and out of the first reconfigurable logic device asynchronously to changing of signals internal to the first reconfigurable logic device.

19. An emulator according to claim 18, wherein signals can be transferred into and out of the second reconfigurable logic device asynchronously to changing of signals internal to the second reconfigurable logic device.

20. An emulator according to claim 5, wherein the first reconfigurable logic device is a first field programmable gate array located on a first chip and the second reconfigurable logic device is a second field programmable gate array located on a second chip separate from the first chip.

* * * * *

UNITED STATES PATENT AND TRADEMARK OFFICE
CERTIFICATE OF CORRECTION

PATENT NO. : 6,947,882 B1  
APPLICATION NO. : 09/404920  
DATED : September 20, 2005  
INVENTOR(S) : Frederic Reblewski et al.

Page 1 of 1

It is certified that error appears in the above-identified patent and that said Letters Patent is hereby corrected as shown below:

Title page,
Item [75], Inventors, replace "Lepaps" with -- Lepape --.
Item [56], References Cited,
U.S. PATENT DOCUMENTS, insert the following:
-- 5,140,193    08/1992        Freeman
   5,943,490    08/1999        Sample --.
FOREIGN PATENT DOCUMENTS, insert the following:
-- JP    04-138569    05/1992
   JP    08-030653    02/1996
   JP    08-508599    10/1996
   JP    11-073440    03/1999 --.

Signed and Sealed this

Eleventh Day of July, 2006

JON W. DUDAS  
*Director of the United States Patent and Trademark Office*